United States Patent
Park et al.

(10) Patent No.: US 10,714,659 B2
(45) Date of Patent: Jul. 14, 2020

(54) LIGHT-EMITTING ELEMENT

(71) Applicant: LG INNOTEK CO., LTD., Seoul (KR)

(72) Inventors: Sun Woo Park, Seoul (KR); Dong Hyun Sung, Seoul (KR); Dae Hee Lee, Seoul (KR); Byoung Woo Lee, Seoul (KR); Kwang Ki Choi, Seoul (KR); Jae Cheon Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 135 days.

(21) Appl. No.: 15/576,760

(22) PCT Filed: May 25, 2016

(86) PCT No.: PCT/KR2016/005541
§ 371 (c)(1),
(2) Date: Nov. 24, 2017

(87) PCT Pub. No.: WO2016/190665
PCT Pub. Date: Dec. 1, 2016

(65) Prior Publication Data
US 2018/0301597 A1 Oct. 18, 2018

(30) Foreign Application Priority Data

May 26, 2015 (KR) .................. 10-2015-0073103

(51) Int. Cl.
*H01L 33/38* (2010.01)
*H01L 33/14* (2010.01)
(Continued)

(52) U.S. Cl.
CPC ............ *H01L 33/387* (2013.01); *H01L 33/14* (2013.01); *H01L 33/26* (2013.01); *H01L 33/382* (2013.01);
(Continued)

(58) Field of Classification Search
CPC ........ H01L 33/14; H01L 33/26; H01L 33/387
See application file for complete search history.

(56) References Cited

U.S. PATENT DOCUMENTS 10,217,905 B2 * 2/2019 Park ..................... H01L 33/30
2010/0096652 A1 4/2010 Choi et al.
(Continued)

FOREIGN PATENT DOCUMENTS

EP 2779797 A1 9/2014
JP 6-296041 A 10/1994
(Continued)

*Primary Examiner* — Seahvosh Nikmanesh
(74) *Attorney, Agent, or Firm* — Birch, Stewart, Kolasch & Birch, LLP

(57) ABSTRACT

Disclosed according to one embodiment is a light-emitting element comprising: a light-emitting structure comprising a first semiconductor layer, an active layer, and a second semiconductor layer; a second conductive layer electrically connected to the second semiconductor layer; a first conductive layer which is disposed in a plurality of via holes passing through the light-emitting structure and second conductive layer and comprises a plurality of through electrodes electrically connected to the first semiconductor layer; an insulation layer for electrically insulating the plurality of through electrodes from the active layer, second semiconductor layer, and second conductive layer; and an electrode pad disposed in an exposed area of the second conductive layer, wherein the farther away the second conductive layer disposed between the plurality of through electrodes is from the electrode pad, the greater the width of the second conductive layer becomes.

7 Claims, 11 Drawing Sheets

(51) Int. Cl.
*H01L 33/26* (2010.01)
*H01L 33/60* (2010.01)
*H01L 33/44* (2010.01)

(52) U.S. Cl.
CPC .............. *H01L 33/60* (2013.01); *H01L 33/44* (2013.01); *H01L 2933/0016* (2013.01)

(56) References Cited

U.S. PATENT DOCUMENTS

| | | |
|---|---|---|
| 2012/0074441 A1 | 3/2012 | Seo et al. |
| 2014/0219304 A1 | 8/2014 | Lee et al. |
| 2015/0111369 A1 | 4/2015 | Kim et al. |

FOREIGN PATENT DOCUMENTS

| | | |
|---|---|---|
| JP | 2009-238834 A | 10/2009 |
| JP | 2014-140067 A | 7/2014 |
| KR | 10-2010-0044726 A | 4/2010 |
| KR | 10-2012-0031339 A | 4/2012 |
| KR | 10-2014-0099379 A | 8/2014 |

\* cited by examiner

【FIG 1】
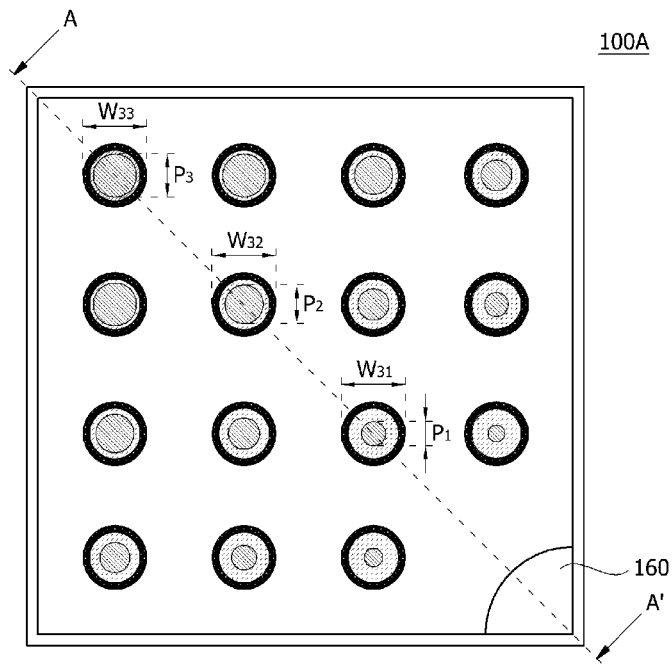
【FIG 2】
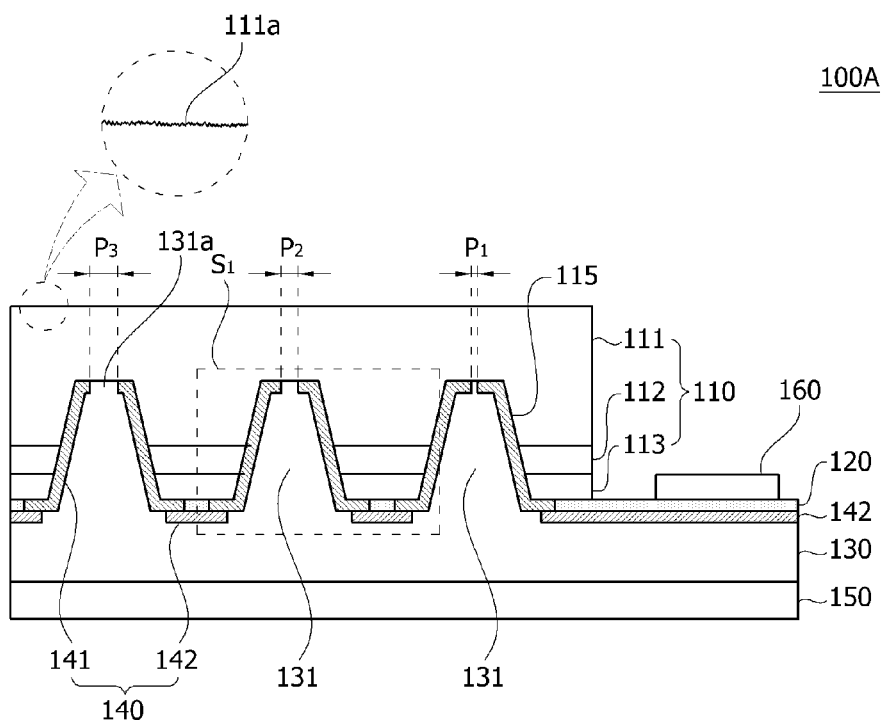

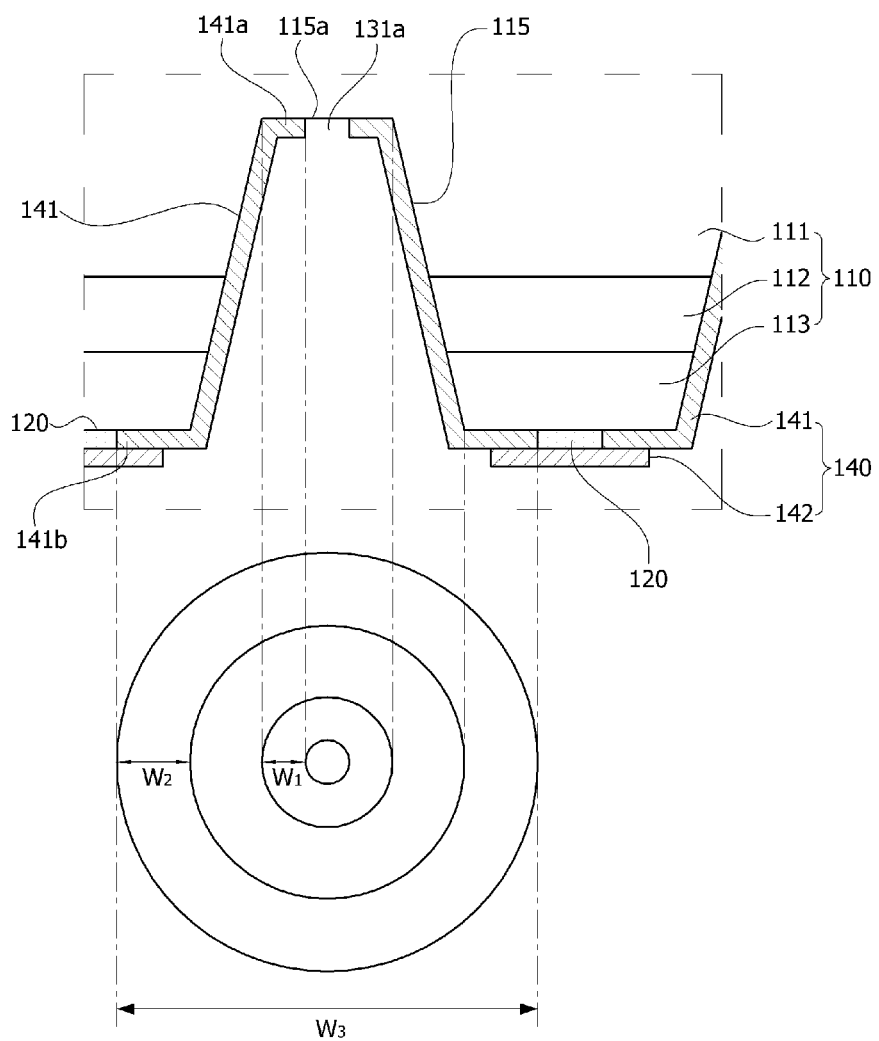
[FIG 3]

【FIG 4a】
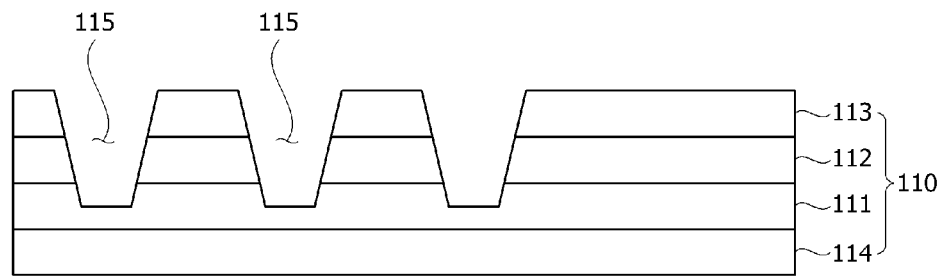
【FIG 4b】
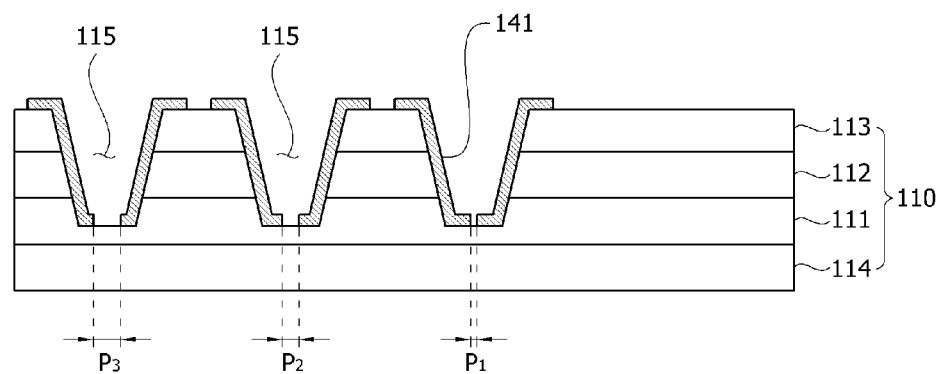
【FIG 4c】
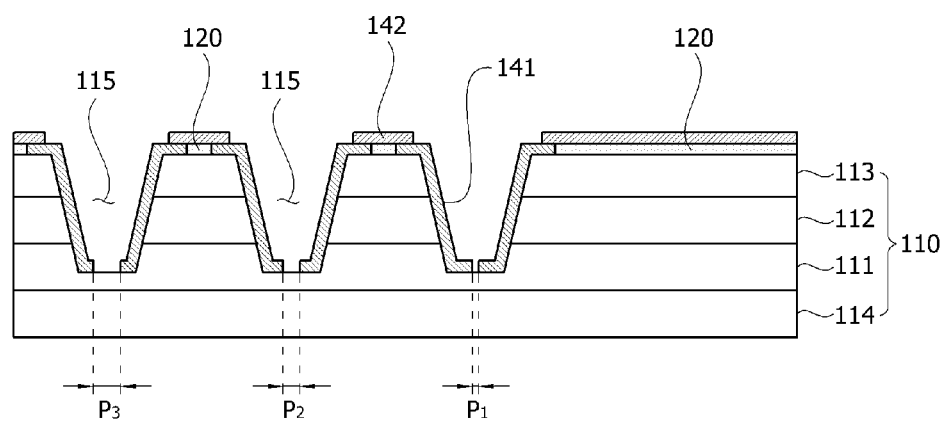

【FIG 4d】
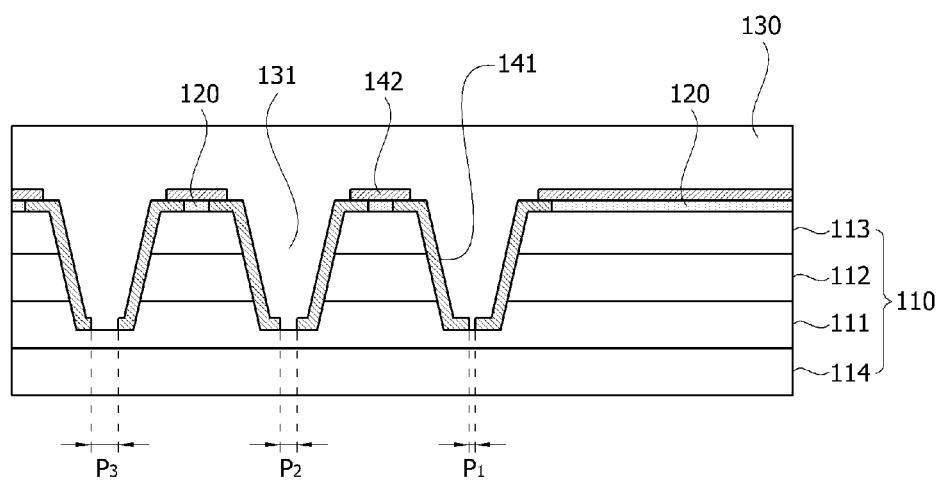
【FIG 4e】
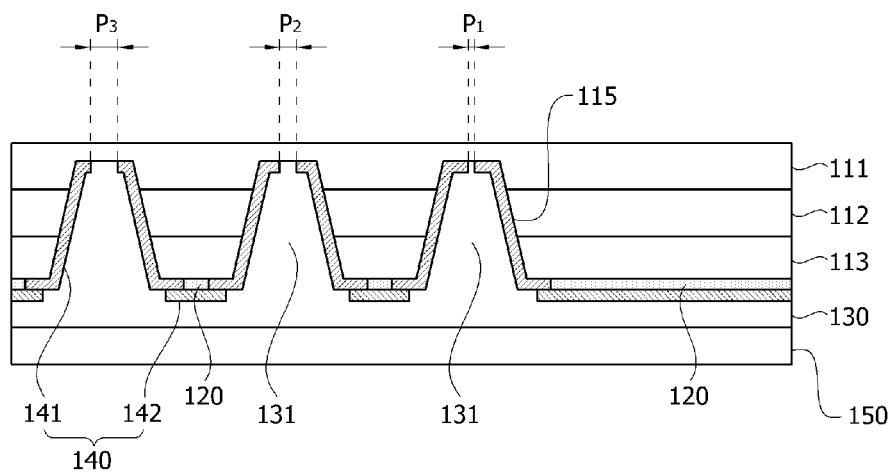

[FIG 4f]
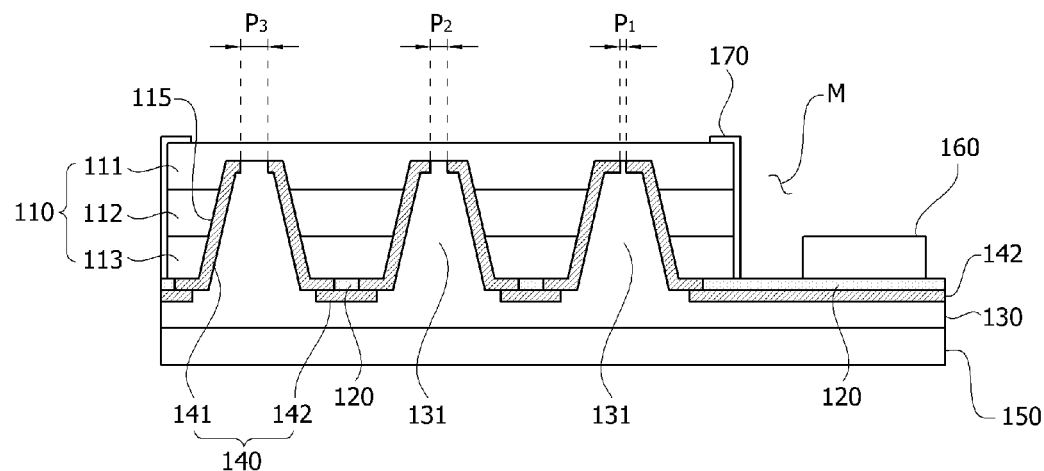
[FIG 5]
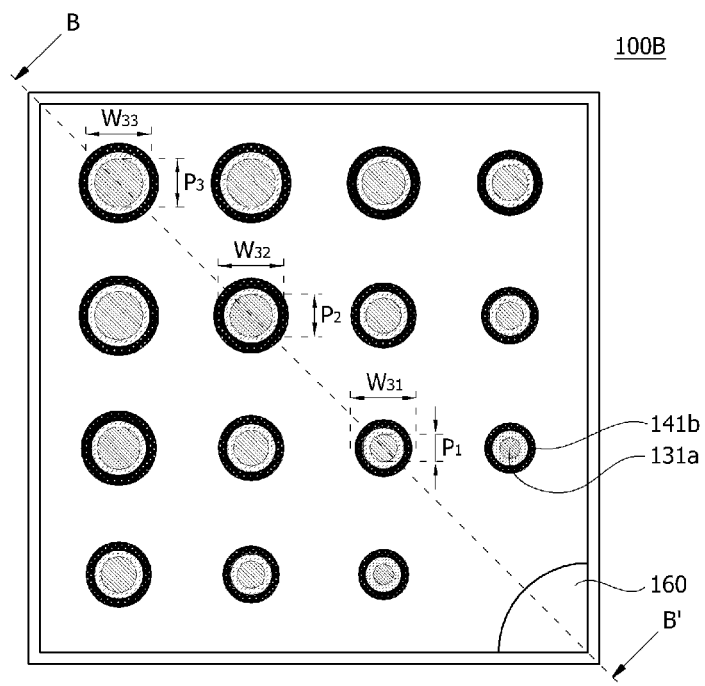

[FIG 6]
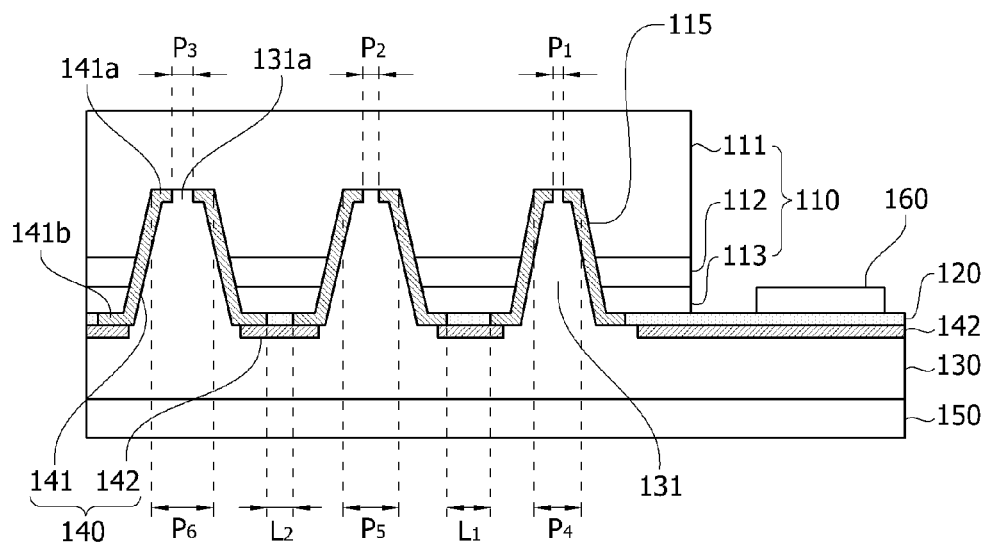
[FIG 7]
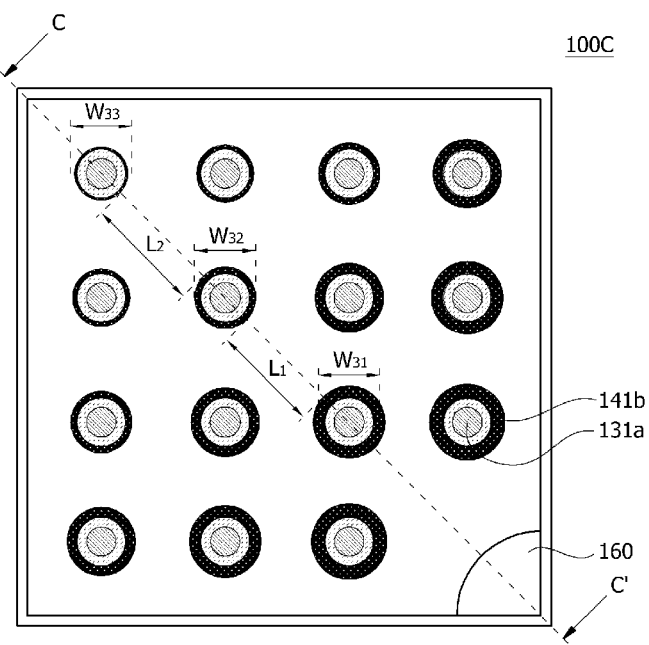

【FIG 8】
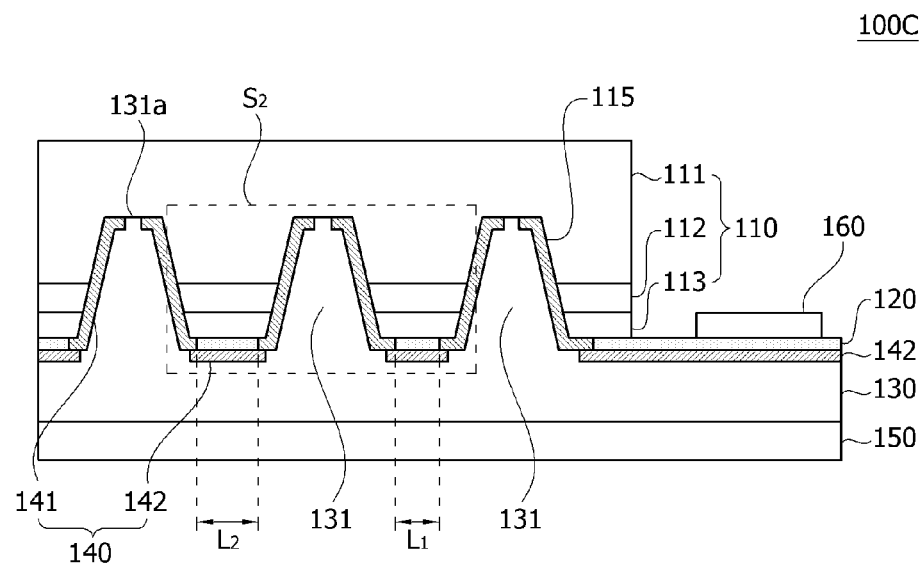
【FIG 9】
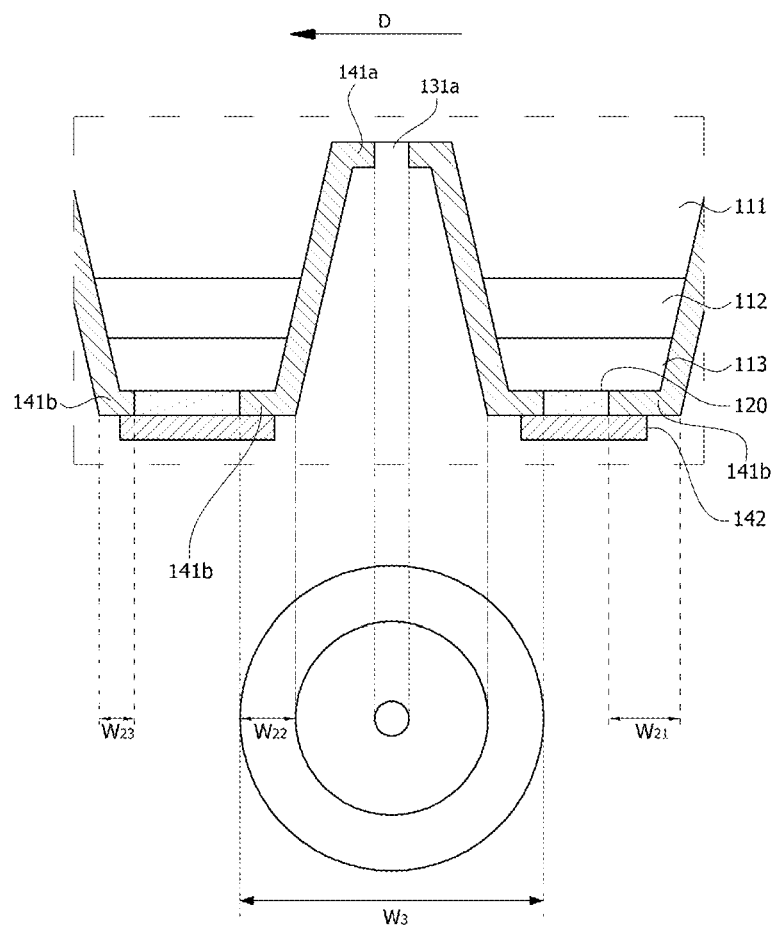

【FIG 10a】
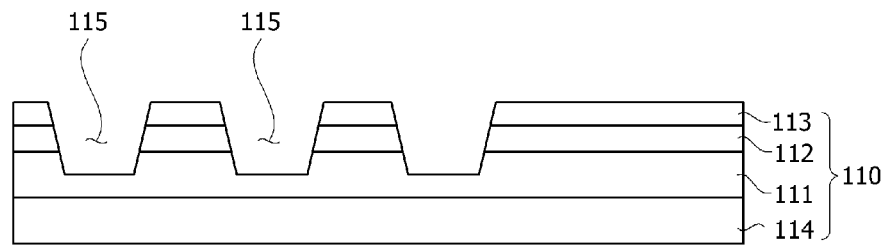
【FIG 10b】
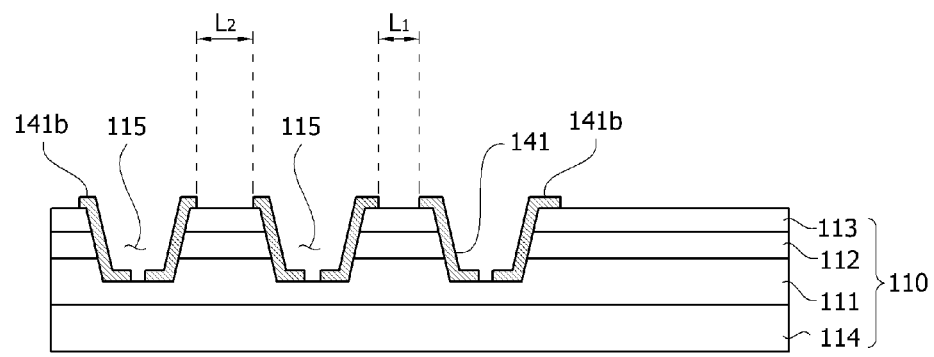
【FIG 10c】
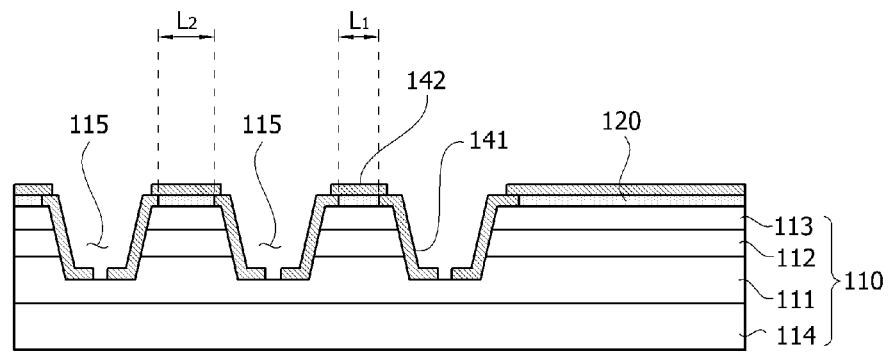

[FIG 10d]
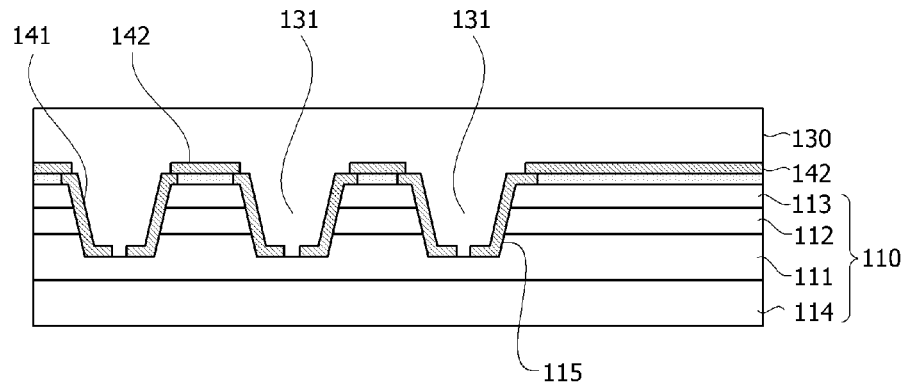
[FIG 10e]
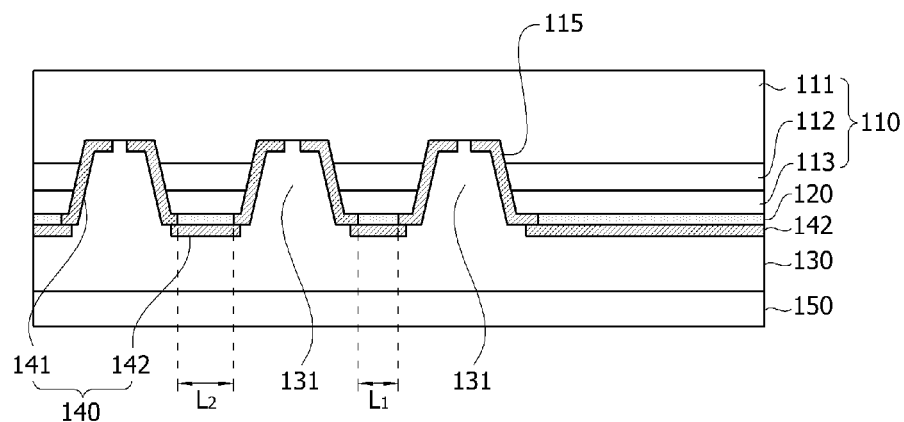
[FIG 10f]
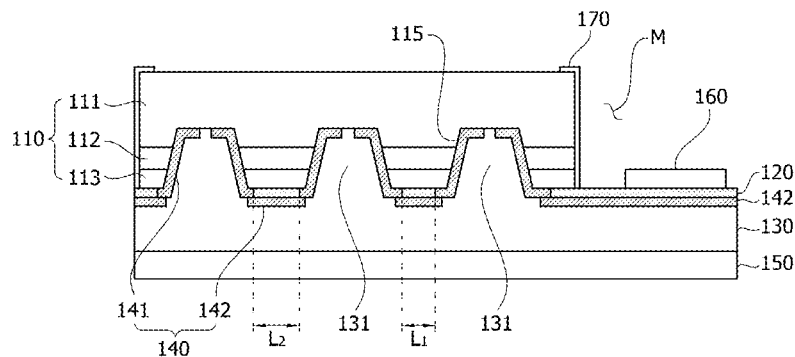

[FIG 11]
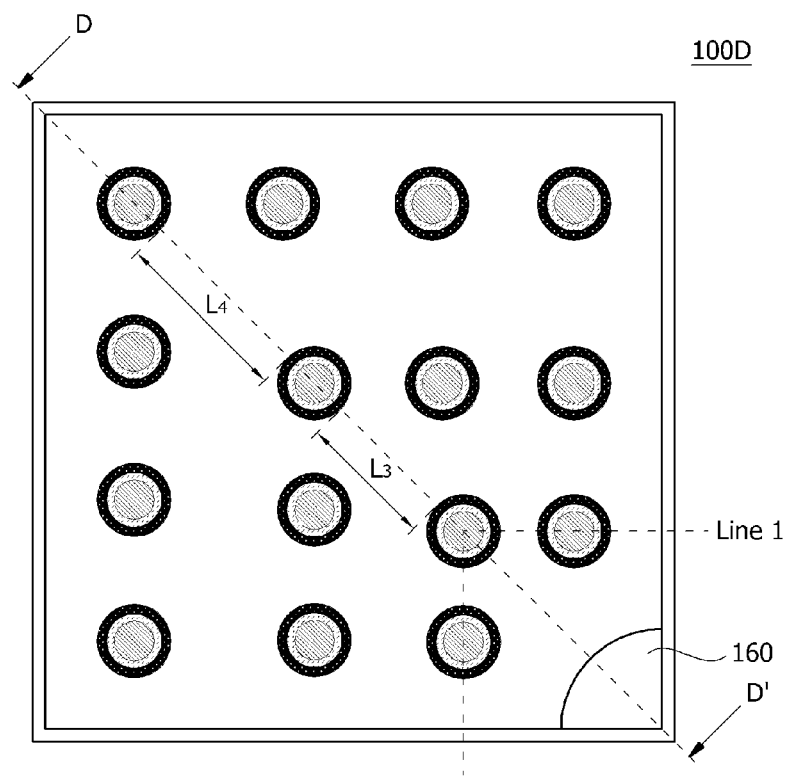
[FIG 12]
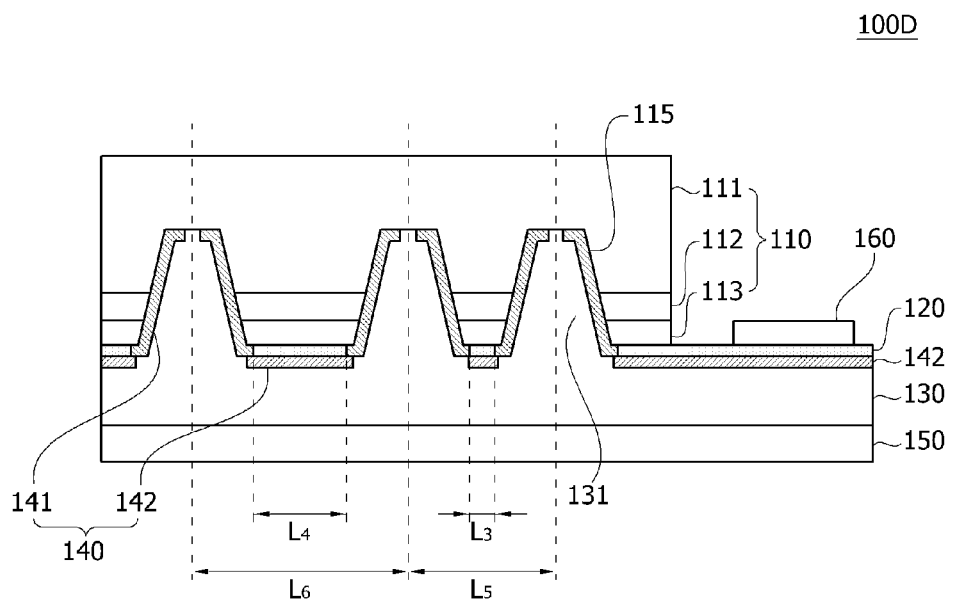

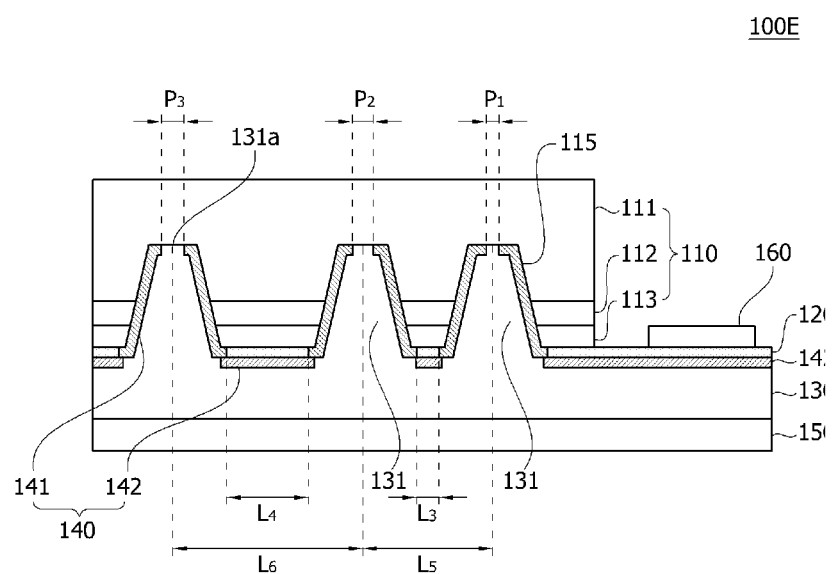
[FIG 13]

LIGHT-EMITTING ELEMENT

CROSS REFERENCE TO RELATED APPLICATIONS

This application is the National Phase of PCT International Application No. PCT/KR2016/005541, filed on May 25, 2016, which claims priority under 35 U.S.C. 119(a) to Patent Application No. 10-2015-0073103, filed in the Republic of Korea on May 26, 2015, all of which are hereby expressly incorporated by reference into the present application.

TECHNICAL FIELD

Embodiments of the present disclosure relate to a light-emitting element having improved luminous efficiency.

BACKGROUND ART

A light-emitting diode (LED) is a light-emitting element that emits light when a current is applied thereto. LEDs can emit light at high efficiency and thus have an excellent energy saving effect.

Recently, a problem with the luminance of LEDs has been significantly addressed, and LEDs are being applied in various devices such as backlight units of liquid crystal display (LCD) devices, electronic sign boards, indicators, home appliances, and the like.

An LED includes a first semiconductor layer, a second semiconductor layer, and an active layer disposed between the first semiconductor layer and the second semiconductor layer, and an electrode pad is formed by etching a portion of a light-emitting structure.

In this case, a current crowding phenomenon in which luminescence coupling is relatively strong occurs in a region adjacent to the electrode pad.

DISCLOSURE

Technical Problem

Embodiments of the present disclosure are directed to providing a light-emitting element having improved luminous efficiency.

The scope of the present disclosure is not limited to the above-described object, and other unmentioned objects may be clearly understood by those skilled in the art from the following descriptions.

Technical Solution

One aspect of the present disclosure provides a light-emitting element including a light-emitting structure including a first semiconductor layer, an active layer, and a second semiconductor layer, a second conductive layer electrically connected to the second semiconductor layer, a first conductive layer including a plurality of through electrodes which are disposed in a plurality of via holes passing through the light-emitting structure and the second conductive layer and are electrically connected to the first semiconductor layer, an insulating layer configured to electrically insulate the plurality of through electrodes from the active layer, the second semiconductor layer, and the second conductive layer, and an electrode pad disposed in an exposed area of the second conductive layer, wherein widths of the second conductive layers disposed between the plurality of through electrodes may increase going away from the electrode pad.

The insulating layer may include a plurality of first insulating layers, which are respectively disposed in the plurality of via-holes and insulate the through electrodes from the active layer, the second semiconductor layer, and the second conductive layer.

The first insulating layer may include a first adjusting portion, which is formed on a bottom surface of the via-hole and partially exposes the bottom surface of the via-hole.

The first insulating layer may include second adjusting portions configured to extend from the via-holes to the second semiconductor layer.

Widths of the plurality of second adjusting portions may decrease going away from the electrode pad.

Widths of the plurality of first adjusting portions may be the same.

The second conductive layer may be disposed between the second adjusting portions.

The insulating layer may include a second insulating layer configured to electrically insulate the plurality of second adjusting portions from the first conductive layer.

Distances between the plurality of through electrodes may increase going away from the electrode pad, the first insulating layer includes a first adjusting portion, which is formed on a bottom surface of the via-hole and partially exposes the bottom surface of the via-hole and a second adjusting portion configured to extend from the via-hole to the second semiconductor layer, and widths of the plurality of first adjusting portions may be the same.

Widths of the plurality of second adjusting portions may be the same.

Widths of the plurality of first adjusting portions may decrease going away from the electrode pad.

The light-emitting element may further include a conductive substrate electrically connected to the first conductive layer.

Advantageous Effects

According to embodiments, a current spreading effect of a light-emitting element is increased so that a uniform luminous efficiency can be attained.

Further, a heat generation characteristic of the light-emitting element is improved so that the lifetime of the light-emitting element can be increased.

Various advantages and effects of the present disclosure are not limited to the above descriptions, and can be more easily understood in descriptions of specific embodiments of the present disclosure.

DESCRIPTION OF DRAWINGS

FIG. 1 is a plan view of a light-emitting element according to a first embodiment of the present disclosure.

FIG. 2 is a cross-sectional view taken along line A-A of FIG. 1.

FIG. 3 is a partially enlarged view of portion $S_1$ of FIG. 1.

FIGS. 4A to 4F are cross-sectional views illustrating a method of manufacturing the light-emitting element according to the first embodiment of the present disclosure.

FIG. 5 is a plan view of a light-emitting element according to a second embodiment of the present disclosure.

FIG. 6 is a cross-sectional view taken along line B-B of FIG. 5.

FIG. 7 is a plan view of a light-emitting element according to a third embodiment of the present disclosure.

FIG. 8 is a cross-sectional view taken along line C-C of FIG. 7.

FIG. 9 is a partially enlarged view of portion $S_2$ of FIG. 8.

FIGS. 10A to 10F are cross-sectional views illustrating a method of manufacturing the light-emitting element according to the third embodiment of the present disclosure.

FIG. 11 is a plan view of a light-emitting element according to a fourth embodiment of the present disclosure.

FIG. 12 is a cross-sectional view taken along line D-D of FIG. 11.

FIG. 13 is a cross-sectional view of a light-emitting element according to a fifth embodiment of the present disclosure.

MODES OF THE INVENTION

The present disclosure may be modified in various forms and may have a variety of embodiments, and, therefore, specific embodiments will be illustrated in the drawings. The embodiments, however, are not to be taken in a sense for limiting the present disclosure to the specific embodiments, and should be construed to include modifications, equivalents, or substitutions within the spirit and technical scope of the present disclosure.

Also, the terms including ordinal numbers such as "first," "second," and the like used herein can be used to describe various components, but the components are not limited by these terms. The terms are used only for the purpose of distinguishing one component from another component. For example, without departing from the scope of the present disclosure, a first component may be referred to as a second component, and similarly, the second component may also be referred to as the first component. The term "and/or" includes a combination of a plurality of related listed items or any one item of the plurality of related listed items.

When a component is referred to as being "connected," or "coupled" to other component, it may be directly connected or coupled to the other component, but it should be understood that another component may exist between the component and the other component. Contrarily, when a component is referred to as being "directly connected," or "directly coupled" to other component, it should be understood that another component may be absent between the component and the other component.

The terms used herein are employed to describe only specific embodiments and are not intended to limit the present disclosure. Unless the context clearly dictates otherwise, the singular form includes the plural form. It should be understood that the terms of "comprise" and "have" specify the presence of stated herein features, numbers, steps, operations, elements, components, or a combination thereof, but do not preclude the presence or probability of addition of one or more another features, numbers, steps, operations, elements, components, or a combination thereof.

Unless otherwise defined, all terms (including technical and scientific terms) used herein have the same meaning as commonly understood by one of ordinary skill in the art to which this disclosure belongs. Terms, such as those defined in commonly used dictionaries, should understood as being interpreted as having a meaning that is consistent with their meaning in the context of the relevant art and not being interpreted in an idealized or overly formal sense unless expressly so defined herein.

Hereinafter, embodiments of the present disclosure will be described in detail with reference to the drawings, the same reference numerals are given to the same or corresponding components regardless of reference numerals, and a repetitive description thereof will be omitted.

First Embodiment

FIG. 1 is a plan view of a light-emitting element according to a first embodiment of the present disclosure, and FIG. 2 is a cross-sectional view taken along line A-A of FIG. 1.

Referring to FIGS. 1 and 2, a light-emitting element 100A according to the first embodiment of the present disclosure includes a light-emitting structure 110, a first conductive layer 130 including a plurality of through electrodes 131 which are electrically connected to a first semiconductor layer 111, a second conductive layer 120 which is electrically connected to a second semiconductor layer 113, an insulating layer 140 which electrically insulates the plurality of through electrodes 131 from each other, and an electrode pad 160 which is disposed in an exposed region of the second conductive layer 120.

The light-emitting structure 110 includes the first semiconductor layer 111, an active layer 112, and the second semiconductor layer 113. There is no limitation on a light emission wavelength band of the light-emitting structure 110. For example, light emitted from the light-emitting structure may be an ultraviolet wavelength-band light, a visible light wavelength-band light, or an infrared wavelength-band light. Components of each layer may be appropriately adjusted to generate light of a desired light emission wavelength-band.

The first semiconductor layer 111 may be implemented with a compound semiconductor such as a III-V group element, a II-VI group element, or the like, and the first semiconductor layer 111 may be doped with a first dopant. The first semiconductor layer 111 may be formed of at least one of a semiconductor material having a composition formula of $Al_xIn_yGa_{1-x-y}N$ ($0 \leq x \leq 1$, $0 \leq y \leq 1$, and $0 \leq x+y \leq 1$), InAlGaN, AlGaAs, GaP, GaAs, GaAsP, and AlGaInP, but the present disclosure is not limited thereto. When the first dopant is an N-type dopant such as Si, Ge, Sn, Se, Te, or the like, the first semiconductor layer 111 doped with the first dopant may be an N-type semiconductor layer.

In the drawing, although the first semiconductor layer 111 is illustrated as a single layer, the first semiconductor layer 111 may have a multi-layer structure. When the first semiconductor layer 111 has a multi-layer structure, the first semiconductor layer 111 may further include an undoped semiconductor layer (not illustrated). The undoped semiconductor layer is a layer which is formed to improve crystallinity of the first semiconductor layer 111, and may have a lower electrical conductivity than the first semiconductor layer 111 because the layer is not doped with a dopant.

The active layer 112 is a layer into which electrons (or holes) injected through the first semiconductor layer 111 and holes (or electrons) injected through the second semiconductor layer 113 meet. In the active layer 112, as the electrons and the holes are recombined, the electrons transition to a lower energy level and light having a wavelength corresponding to the transition energy level is generated.

The active layer 112 may have any one of a single well structure, a multi-well structure, a single quantum well (SQW) structure, a multiple quantum well (MQW) structure, a quantum dot structure, and a quantum wire structure, and the structure of the active layer 112 is not limited thereto.

When the active layer 112 is formed to have a well structure, a well layer/a barrier layer of the active layer 112 may be formed to include at least one of paired structures InGaN/GaN, InGaN/InGaN, GaN/AlGaN, InAlGaN/GaN, GaAs(InGaAs)/AlGaAs, or GaP(InGaP)/AlGaP, but the present disclosure is not limited thereto. The well layer may be formed of a material having a bandgap smaller than a that of the barrier layer.

The second semiconductor layer 113 may be implemented using a compound semiconductor such as a III-V group element, a II-VI group element, or the like, and the second semiconductor layer 113 may be doped with a second dopant. The second semiconductor layer 113 may be formed of a semiconductor material having a composition formula of $In_xAl_yGa_{1-x-y}N$ ($0 \le x \le 1$, $0 \le y \le 1$, and $0 \le x+y \le 1$), or a material selected from a group consisting of AlInN, AlGaAs, GaP, GaAs, GaAsP, and AlGaInP. When the second dopant is a P-type dopant such as Mg, Zn, Ca, Sr, Ba, or the like, the second semiconductor layer 113 doped with the second dopant may be a P-type semiconductor layer.

The light-emitting structure 110 may include a first semiconductor layer 111 which is an N-type semiconductor layer and a second semiconductor layer 113 which is a P-type semiconductor layer, or may include a first semiconductor layer 111 which is a P-type semiconductor layer and a second semiconductor layer 113 which is an N-type semiconductor layer.

Further, the light-emitting structure 110 may have a structure in which an N-type or P-type semiconductor layer is further formed between the second semiconductor layer 113 and the active layer 112. That is, the light-emitting structure 110 of the embodiment may be formed to have at least one of N-P, P-N, N-P-N, and P-N-P junction structures, and may have variable structures including an N-type semiconductor layer and a P-type semiconductor layer.

Impurities in the first semiconductor layer 111 and the second semiconductor layer 113 may be formed to have a uniform or non-uniform doping concentration. That is, the light-emitting structure 110 may be formed to have various doping profile, but the present disclosure is not limited thereto.

An upper surface of the light-emitting structure 110 may have a regular or irregular uneven portion 111a, but the present disclosure is not limited thereto. For example, the upper surface of the first semiconductor layer 111 may be a flat surface.

The first conductive layer 130 is electrically connected to the first semiconductor layer 111. Specifically, the first conductive layer 130 may include the plurality of through electrodes 131. The through electrodes 131 may be disposed in via-holes 115 formed in the light-emitting structure 110. The first conductive layer 130 may be electrically connected to the conductive substrate 150 disposed therebelow.

The first conductive layer 130 may be formed with a transparent conductive oxide (TCO) film. The TCO film may be one selected from a group consisting of indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, $IrO_x$, $RuO_x$, NiO, and the like.

The first conductive layer 130 may include an opaque metal such as Ag, Ni, Al, Rh, Pd, Ir, Ru, Mg, Zn, Pt, Au, Hf, or the like. Further, the first conductive layer 130 may be formed as a single layer or a plurality of layers in which a TCO film and an opaque metal are mixed, but the present disclosure is not limited thereto.

The second conductive layer 120 is electrically connected to the second semiconductor layer 113. The second conductive layer 120 may be disposed in regions between the plurality of through electrodes 131. The second conductive layer 120 may be electrically connected to the electrode pad 160 by exposing one region thereof.

The second conductive layer 120 may be formed of a material having a high reflectivity such as Ag, Ni, Al, Rh, Pd, Ir, Ru, Mg, Zn, Pt, Au, Hf, or the like, or may be formed of a mixture of the material having a high reflectivity and a transparent conductive material such as IZO, IZTO, IAZO, IGZO, IGTO, AZO, ATO, or the like.

The second conductive layer 120 may further include an ohmic layer. The ohmic layer may include at least one selected from a group consisting of ITO, IZO, indium zinc tin oxide IZTO, IAZO, IGZO, IGTO, AZO, ATO, GZO, IZON, Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf, but the present disclosure is not limited to these materials.

The insulating layer 140 may be formed of at least one selected from a group consisting of $SiO_2$, $Si_xO_y$, $Si_3N_4$, $Si_xN_y$, $SiO_xN_y$, $Al_2O_3$, $TiO_2$, AlN, and the like, but the present disclosure is not limited thereto.

The insulating layer 140 may include a first insulating layer 141 which electrically insulates the through electrodes 131 from the active layer 112 and the second semiconductor layer 113, and may include a second insulating layer 142 which electrically insulates the second conductive layer 120 from the first conductive layer 130. Therefore, the insulating layer 140 may have an increased thickness in a region in which the first insulating layer 141 and the second insulating layer 142 overlap. According to such a configuration, since the second conductive layer 120 is formed after the first insulating layer 141 is formed, defects due to migration of the second conductive layer 120 when the via-holes 115 are formed may be prevented.

However, the present disclosure is not limited thereto, and the first insulating layer 141 and the second insulating layer 142 may be integrally formed. The first insulating layer 141 and the second insulating layer 142 may be integrally formed by first forming the second conductive layer 120 on the second semiconductor layer 113 and then forming the via-holes 115.

The plurality of through electrodes 131 may be formed so that areas of contact regions (hereinafter, referred to as first regions) thereof electrically connected to the first semiconductor layer 111 decrease going away from the electrode pad 160 ($P_3 > P_2 > P_1$). That is, areas of first regions 131a of the plurality of through electrodes 131 may be different from each other. A separate ohmic contact electrode may be disposed in each of the first regions 131a.

Generally, since density of holes is high in a region adjacent to the electrode pad 160, luminescence coupling may be relatively strong. Therefore, current crowding may occur in the region adjacent to the electrode pad 160. On the contrary, since density of holes is low in a region further away from the electrode pad 160, luminescence coupling may be relatively weak. Therefore, light emission uniformity in the entire light-emitting element may be reduced.

In the first embodiment of the present disclosure, current crowding may be reduced by reducing an effective area $P_1$ of the first region 131a in a region in which luminescence coupling is strong, that is, a region close to the electrode pad 160. With such a configuration, an operating voltage $V_f$ of the light-emitting element may be reduced.

Further, luminescence coupling may be increased by increasing an effective area $P_3$ of the first region 131a in a region relatively far from the electrode pad 160. Therefore, since the luminescence coupling in a region close to the electrode pad 160 becomes relatively lower and the luminescence coupling in a region far from the electrode pad 160 is increased, overall uniform light may be emitted.

Referring to FIG. 3, the first region 131a may be controlled by the first insulating layer 141. The first insulating layer 141 may include a first adjusting portion 141a which extends to a bottom surface 115a of the through electrode 131, and a second adjusting portion 141b which extends from the via-hole 115 to the second semiconductor layer 113.

In the present embodiment, there are no specific limitations on a width $W_2$ of the second adjusting portion 141b. For example, all of widths $W_2$ of the plurality of second adjusting portions 141b may be the same. Therefore, all of widths $W_3$ of the plurality of first insulating layers 141 may be the same. All widths of the second conductive layers 120 disposed between the second adjusting portions 141b may also be the same.

The area of the first region 131a may be adjusted by a width $W_1$ of the first adjusting portion 141a which extends to the bottom surface 115a of the via-hole 115. That is, when the width $W_1$ of the first adjusting portion 141a increases, the area of the first region 131a decreases. On the contrary, when the width $W_1$ of the first adjusting portion 141a decreases, the area of the first region 131a increases. The width of the first adjusting portion 141a may be adjusted using a mask pattern or the like during manufacturing.

In the drawing, the first region 131a and the first insulating layer 141 are illustrated as a circular shape, but the present disclosure is not limited thereto. The first region 131a and the first insulating layer 141 may have a polygonal or line shape. Table 1 below is a table obtained by measuring a change in the areas of the first regions 131a according to distances between three through electrodes 131 and the electrode pad 160, which are illustrated in FIG. 2. The three through electrodes 131 are defined as a first through electrode, a second through electrode, and a third through electrode, in order of closeness to the electrode pad.

TABLE 1

|  | First Through Electrode | Second Through Electrode | Third Through Electrode |
|---|---|---|---|
| Distance (μm) from Electrode Pad | 163.8 | 568.8 | 973.8 |
| Radius (μm) of Via-hole | 25.0 | 25.0 | 25.0 |
| Width (μm) of First Adjusting Portion | 12 (100%) | 10.3 (85.8%) | 7.7 (64.2%) |
| Radius (μm) of First Region | 13 | 14.7 | 17.3 |
| Area (μm²) of First Region | 530.9 (100%) | 678.9 (127.9%) | 940.2 (177.1%) |

Referring to Table 1, it can be seen that the area of the first region 131a of the first through electrode 131 closest to the electrode pad 160 is 530.9 μm², while the area of the first region 131a of the third through electrode 131 farthest from the electrode pad 160 is 940.2 μm², a 177% increase. When such an arrangement is provided, light emission uniformity may be excellent.

It can be seen that the width of the first adjusting portion 141a decreases by about 5.3 nm as the distance from the first through electrode 131 increases by 1 μm. Therefore, the width of the first adjusting portion 141a disposed on each of the plurality of through electrodes 131 may satisfy the following Expression 1.

$$L_n = L_1 - (D_{n-1} \times Y)$$ [Expression 1]

Here, $L_n$ denotes a width of a first adjusting portion disposed on an $n^{th}$ through electrode, $L_1$ denotes a width of a first adjusting portion of a reference through electrode closest to the electrode pad, $D_{n-1}$ denotes an interval between the $n^{th}$ through electrode and the reference through electrode, and Y denotes a constant which satisfies a condition of 3.0 nm<W<8.0 nm.

Referring to FIG. 4, a method of manufacturing a light-emitting element according to the first embodiment of the present disclosure includes forming the via-holes 115 in the light-emitting structure 110, forming the first insulating layers 141 in the via-holes 115, forming the second conductive layer 120 on the second semiconductor layer 113 between the first insulating layers 141, forming the second insulating layer 142 on the second conductive layer 120, forming the first conductive layer 130 including the through electrodes 131 disposed in the via-holes 115, forming the conductive substrate 150 electrically connected to the first conductive layer 130, and forming the electrode pad 160 by exposing a portion of the second conductive layer 120.

Referring to FIG. 4A, in the forming of the light-emitting structure, the first semiconductor layer 111, the active layer 112, and the second semiconductor layer 113 are formed on a growth substrate 114, and the plurality of via-holes 115 passing from the second semiconductor layer 113 to a portion of the first semiconductor layer 111 are formed. Diameters of the via-holes 115 may be the same.

Referring to FIG. 4B, in the forming of the first insulating layer, the first insulating layer 141 may be formed in the via-hole 115 using a mask pattern (not illustrated). A thickness of the first insulating layer 141 may range from 600 nm to 800 nm, but the present disclosure is not limited thereto.

The first insulating layer 141 may be formed to extend from a bottom surface of the via-hole 115 to a portion of the second semiconductor layer 113. In this case, areas of the first insulating layers 141 respectively formed on the bottom surfaces 115a of the via-holes 115 may be different from each other. Specifically, referring to FIG. 4B, exposed areas of the first via-holes 115 may increase going toward the left ($P_3 > P_2 > P_1$).

Referring to FIG. 4C, in the forming of the second conductive layer, the second conductive layer 120 may be formed on the second semiconductor layer 113 exposed between the first insulating layers 141. A thickness of the second conductive layer 120 may be smaller than the thickness of the first insulating layer 141. The thickness of the second conductive layer 120 may range from 100 nm to 500 nm, but the present disclosure is not limited thereto.

Then, in the forming of the second insulating layer, the second insulating layer 142 may be formed on the second conductive layer 120 to seal the second conductive layer 120. To this end, an end portion of the second insulating layer 142 may be in contact with the first insulating layer 141. Therefore, a thickness of a portion in which the first insulating layer 141 and the second insulating layer 142 are into contact with each other may increase. A thickness of the second insulating layer 142 may range from 200 nm to 500 nm, but the present disclosure is not limited thereto.

Referring to FIG. 4D, in the forming of the first conductive layer 130, the plurality of via-holes 115 are filled with electrodes to form the through electrode 131. With the above-described configuration, the areas of the first regions of the through electrodes 131 may increase going toward the left ($P_3 > P_2 > P_1$).

Referring to FIG. 4E, in the forming of the conductive substrate 150, the conductive substrate 150 is formed on the first conductive layer 130. In this case, the insulating substrate 114 of the light-emitting structure 110 may be removed. A laser lift-off method may be used as a method of removing the insulating substrate 114, but the present disclosure is not limited thereto. In this case, an uneven portion may be formed on an upper surface of the light-emitting structure 110 as necessary.

Referring to FIG. 4F, in the forming of the electrode pad, one side of the light-emitting structure 110 is etched (M) to expose the second conductive layer 120, and the electrode pad 160 is then formed thereon. A protective layer 170 may be formed on side surfaces of the light-emitting structure 110.

Second Embodiment

FIG. 5 is a plan view of a light-emitting element according to a second embodiment of the present disclosure, and FIG. 6 is a cross-sectional view taken along line B-B of FIG. 5.

Referring to FIGS. 5 and 6, a light-emitting element 100B according to the second embodiment of the present disclosure includes a light-emitting structure 110 including a first semiconductor layer 111, an active layer 112, and a second semiconductor layer 113, a first conductive layer 130 including a plurality of through electrodes 131 electrically connected to the first semiconductor layer 111, a second conductive layer 120 electrically connected to the second semiconductor layer 113, an insulating layer 140 which electrically insulates the plurality of through electrodes 131 from each other, and an electrode pad 160 disposed in an exposed region of the second conductive layer 120.

The components may be the same as those in the first embodiment described above, but a configuration in which an area of a first region 131a is adjusted is different from that in the first embodiment described above. Therefore, the configuration in which the area of the first region 131a is adjusted will be described in detail.

Diameters of upper end portions of the plurality of through electrodes 131 may increase going away from the electrode pad 160 ($P_6 > P_5 > P_4$). Therefore, when widths of first adjusting portions 141a of the insulating layers 140 are the same, areas of the first regions 131a of the through electrodes 131 increase. That is, exposed areas may be adjusted by changing the diameters of the upper end portions of the through electrodes 131. Such a structure has the same effect as that in the first embodiment described above, and has an advantage in that an existing mask pattern may be used as is.

Table 2 below is a table obtained by measuring a change in the areas of the first regions 131a according to distances between three through electrodes 131 and the electrode pad 160, which are illustrated in FIG. 5.

TABLE 2

|  | First Through Electrode | Second Through Electrode | Third Through Electrode |
| --- | --- | --- | --- |
| Distance (μm) from Electrode Pad | 163.8 | 568.8 | 973.8 |
| Radius (μm) of Via-hole | 25.0 | 26.7 | 29.3 |
| Width (μm) of First Adjusting Portion | 12 | 12 | 12 |
| Radius (μm) of First Region | 13 | 14.7 | 17.3 |
| Area (μm²) of First Region | 530.9(100%) | 678.9(127.9%) | 940.2(177.1%) |

According to the present disclosure, the light-emitting element 100B has a structure in which diameters of the through electrodes (or the via-holes) increase going away from the electrode pad 160 and exposed areas of the first regions 131a increase. In this case, diameters of second adjusting portions 141b of the first insulating layers 141 increase. Therefore, diameters of the first insulating layers 141 may increase going away from the electrode pad 160 ($W_{33} > W_{32} > W_{31}$), and widths of the second conductive layers 120 disposed between the second adjusting portions 141b may decrease ($L_1 > L_2$).

In this drawing, the first region and the first insulating layer are illustrated as a circular shape, but the present disclosure is not limited thereto. The first region and the first insulating layer may have a polygonal or line shape.

Third Embodiment

FIG. 7 is a plan view of a light-emitting element according to a third embodiment of the present disclosure, FIG. 8 is a cross-sectional view taken along line C-C of FIG. 7, FIG. 9 is a partially enlarged view of portion $S_2$ of FIG. 8, and FIGS. 10A to 10F are cross-sectional views illustrating a method of manufacturing the light-emitting element according to the third embodiment of the present disclosure.

Referring to FIGS. 7 and 8, a light-emitting element 100C according to the third embodiment of the present disclosure includes a light-emitting structure 110 including a first semiconductor layer 111, an active layer 112, and a second semiconductor layer 113, a first conductive layer 130 including a plurality of through electrodes 131 electrically connected to the first semiconductor layer 111, a second conductive layer 120 which is electrically connected to the second semiconductor layer 113 and is disposed between the through electrodes 131, a plurality of insulating layers 140 which electrically insulate the plurality of through electrodes 131 from each other, and an electrode pad 160 disposed in an exposed region of the second conductive layer 120.

The first conductive layer 130 is electrically connected to the first semiconductor layer 111. Specifically, the first conductive layer 130 may include the plurality of through electrodes 131. The through electrodes 131 may be disposed in via-holes 115 formed in the light-emitting structure 110. The first conductive layer 130 may be electrically connected to a conductive substrate 150 disposed therebelow.

The second conductive layer 120 is electrically connected to the second semiconductor layer 113. The second conductive layer 120 may be disposed in regions between the plurality of through electrodes 131. The second conductive layer 120 may be electrically connected to the electrode pad 160 by exposing one region thereof.

Each of the insulating layers 140 may include a first insulating layer 141 which electrically insulates the through electrodes 131 from the active layer 112 and the second semiconductor layer 113, and a second insulating layer 142 which electrically insulates the second conductive layer 120 from the first conductive layer 130. Therefore, each of the insulating layers 140 may have an increased thickness in a region in which the first insulating layer 141 and the second insulating layer 142 overlap.

However, the present disclosure is not limited thereto, and the first insulating layer 141 and the second insulating layer 142 may be integrally formed. The first insulating layer 141 and the second insulating layer 142 may be integrally formed by first forming the second conductive layer 120 on the second semiconductor layer 113 and then forming the via-holes 115.

Diameters of the first insulating layers 141 may decrease going away from the electrode pad 160 ($W_{31}>W_{32}>W_{33}$), and widths $L_1$ and $L_2$ of the second conductive layers 120 may increase going away from the electrode pad 160 on an imaginary line C-C (in FIG. 7) which connects the plurality of through electrodes 131 in the electrode pad 160 ($L_2>L_1$). That is, the widths of the second conductive layers 120 divided by the plurality of through electrodes 131 on the imaginary line may be different from each other. In this case, all widths of the first regions 131a may be the same.

Generally, in a region adjacent to the electrode pad 160, density of holes is so high that relatively strong luminescence coupling may occur. Therefore, current crowding may occur in the region adjacent to the electrode pad 160. On the other hand, in a region further away from the electrode pad 160, density of holes is so low that relatively weak luminescence coupling may occur. Therefore, light emission uniformity of the entire light-emitting element may be reduced.

In the third embodiment of the present disclosure, density of holes in a region in which luminescence coupling is strong, that is, a region close to the electrode pad 160, is reduced and thus current crowding may be reduced.

Further, density of holes in a region relatively far from the electrode pad 160 is increased and thus luminescence coupling may be increased. Therefore, since luminescence coupling in a region close to the electrode pad 160 becomes relatively lower and luminescence coupling in a region far from the electrode pad 160 is increased, uniform light emission may be achieved throughout.

Referring to FIG. 9, each of the first insulating layers 141 may include a first adjusting portion 141a which exposes the first region 131a, and a second adjusting portion 141b which covers a portion of the second semiconductor layer 113. The width of the second conductive layer 120 may be adjusted by the width of the second adjusting portion 141b.

For example, widths of the second adjusting portions 141b may gradually decrease going in a direction of an arrow D ($W_{23}<W_{22}<W_{21}$). When the second adjusting portions 141b have a ring shape, diameters of the second adjusting portions 141b may decrease going in the direction of the arrow D. As a result, a diameter $W_3$ of the first insulating layer 141 decreases going in the direction of the arrow D, and an area of the second conductive layer 120 disposed between the first adjusting portions 141a increases. Therefore, a width of the second conductive layer 120 in a region closest to the electrode pad 160 becomes relatively lower, and thus density of holes in the region closest to the electrode pad 160 may be reduced and density of holes in the region relatively far from the electrode pad 160 may be increased.

In the drawing, the first region and the first insulating layer are illustrated as a circular shape, but the present disclosure is not limited thereto. The first region and the first insulating layer may have a polygonal or line shape.

Referring to FIG. 10, a method of manufacturing a light-emitting element according to the third embodiment of the present disclosure includes forming the via-holes 115 in the light-emitting structure 110, forming the first insulating layers 141 in the via-holes 115, forming the second conductive layer 120 on the second semiconductor layer 113 between the first insulating layers 141, forming the second insulating layer 142 on the second conductive layer 120, forming the first conductive layer 130 including the through electrodes 131 disposed in the via-holes 115, forming the conductive substrate 150 electrically connected to the first conductive layer 130, and forming the electrode pad 160 by exposing a portion of the second conductive layer 120.

Referring to FIG. 10A, in the forming of the light-emitting structure, the first semiconductor layer 111, the active layer 112, and the second semiconductor layer 113 are formed on an insulating substrate 114, and the plurality of via-holes 115 passing from the second semiconductor layer 113 to a portion of the first semiconductor layer 111 are formed. Diameters of the via-holes 115 may be the same.

Referring to FIG. 10B, in the forming of the first insulating layers 141, the first insulating layers 141 may be formed in the via-holes 115 using a mask pattern (not illustrated). Each of the first insulating layers 141 may include a second adjusting portion 141b formed to extend to a portion of the second semiconductor layer 113. In this case, widths of the second adjusting portions 141b may be different from each other.

Specifically, referring to FIG. 10B, the width of the second adjusting portion 141b disposed at the right side may be the largest, and the widths of the second adjusting portions 141b may decrease going toward the left. Therefore, distances between the second adjusting portions 141b increase toward the left ($L_2>L_1$).

Referring to FIG. 10C, in the forming of the second conductive layer 120, the second conductive layer 120 may be formed on the second semiconductor layer 113 exposed between the first insulating layers 141. The second conductive layer 120 may serve as a reflective layer. With the above-described configuration, an area of the second conductive layer 120 increases toward the left ($L_2>L_1$).

Then, in the forming of the second insulating layer 142, the second insulating layer 142 may be formed on the second conductive layer 120 to seal the second conductive layer 120. To this end, an end portion of the second insulating layer 142 may be in contact with the first insulating layer 141. Therefore, a thickness of a portion in which the first insulating layer 141 and the second insulating layer 142 are into contact with each other may increase.

Referring to FIG. 10D, in the forming of the first conductive layer, the plurality of via-holes 115 are filled with electrodes to form the through electrodes 131. The first conductive layer 130 may connect the plurality of through electrodes 131 to each other.

Referring to FIG. 10E, in the forming of the conductive substrate, the conductive substrate 150 is formed on the first conductive layer 130. In this case, the insulating substrate 114 of the light-emitting structure 110 may be removed. A laser lift-off method may be used as a method of removing the insulating substrate 114, but the present disclosure is not limited thereto. In this case, an uneven portion may be formed on an upper surface of the light-emitting structure 110 as necessary.

Referring to FIG. 10F, in the forming of the electrode pad 160, one side of the light-emitting structure 110 is etched (M) to expose the second conductive layer 120, and the electrode pad 160 may then be formed thereon. A separate protective layer 170 may be formed on side surfaces of the light-emitting structure 110.

Fourth Embodiment

FIG. 11 is a plan view of a light-emitting element according to a fourth embodiment of the present disclosure, and FIG. 12 is a cross-sectional view taken along line D-D of FIG. 11.

Referring to FIGS. 11 and 12, a light-emitting element 100D according to the fourth embodiment of the present disclosure includes a light-emitting structure 110 including a first semiconductor layer 111, an active layer 112, and a second semiconductor layer 113, a first conductive layer 130 including a plurality of through electrodes 131 which are electrically connected to the first semiconductor layer 111, a second conductive layer 120 which is electrically connected to the second semiconductor layer 113 and is disposed between the through electrodes 131, a plurality of insulating layers 140 which electrically insulate the plurality of through electrodes 131 from each other, and an electrode pad 160 disposed in an exposed region of the second conductive layer 120.

The components may be same as those in the third embodiment described above, but a configuration in which an area of the second conductive layer 120 is adjusted is different from that in the third embodiment described above. Therefore, the configuration in which the area of the second conductive layer 120 is adjusted will be described in detail.

Distances between the through electrodes 131 may increase going away from the electrode pad 160 ($L_6 > L_5$). Therefore, the area of the second conductive layer 120 increases going away from the electrode pad 160 ($L_4 > L_3$). A length of a second insulating layer 142 also increases to insulate the second conductive layer 120 therefrom.

In the drawing, the first region and the first insulating layer are illustrated as a circular shape, but the present disclosure is not limited thereto. The first region and the first insulating layer may have a polygonal or line shape.

Fifth Embodiment

FIG. 13 is a cross-sectional view of a light-emitting element according to a fifth embodiment of the present disclosure.

Referring to FIG. 13, in a light-emitting element 100E according to the fifth embodiment of the present disclosure, areas of first regions of through electrodes 131 may increase going away from an electrode pad 160 ($P_3 > P_2 > P_1$), and an area of a second conductive layer 120 may also increase going away from the electrode pad 160 (L4>L3). According to such a configuration, since a charge injection area and a hole injection area are simultaneously reduced in a region adjacent to the electrode pad 160, current crowding may be further reduced.

There is no limitation on a configuration for controlling an area of the first region 131a and an area of the second conductive layer 120. For example, the area of the first region 131a may be controlled according to the first embodiment and the area of the second conductive layer 120 may be controlled according to the third embodiment. Alternatively, the area of the first region 131a may be controlled according to the second embodiment and the area of the second conductive layer 120 may be controlled according to the fourth embodiment.

A plurality of light-emitting elements according to the first to fifth embodiments may be disposed on a substrate in an array, and an optical member such as a light guide plate, a prism sheet, a diffusion sheet, or the like may be disposed on a light path of a light-emitting element package. The light-emitting element package, the substrate, and the optical member may function as a backlight unit.

Further, the light-emitting element package, the substrate, and the optical member may be implemented as a display device, an indication device, or a lighting device including the light-emitting element package according to the embodiment.

Here, the display device may include a bottom cover, a reflective plate disposed on the bottom cover, a light-emitting module which emits light, a light guide plate which is disposed in front of the reflective plate and guides light emitted from the light-emitting module forward, an optical sheet including a prism sheet disposed in front of the light guide plate, a display panel disposed in front of the optical sheet, an image signal output circuit which is connected to the display panel and supplies an image signal to the display panel, and a color filter disposed in front of the display panel. Here the bottom cover, the reflective plate, the light-emitting module, the light guide plate, and the optical sheet may form a backlight unit.

Further, the lighting device may include a light source module including a substrate and the light-emitting element package according to the embodiment, a heat radiator for radiating heat of the light source module, and a power supply for processing or converting an electrical signal provided from the outside and providing the electrical signal to the light source module. For example, the lighting device may include a lamp, a head lamp, or a street lamp.

The head lamp may include a light-emitting module including a light-emitting element package disposed on a substrate, a reflector which reflects light emitted from the light-emitting module in a predetermined direction, for example, forward, a lens which refracts the light reflected by the reflector, and a shade which blocks or reflects a portion of the light reflected by the reflector and is directed to the lens to provide a desired light distribution pattern of the designer.

While the present disclosure has been mainly described with reference to the embodiments, and it should be understood that the present disclosure is not limited to the disclosed exemplary embodiments, and that various modifications and applications can be devised by those skilled in the art without departing from the gist of the present disclosure. For example, each component specifically shown in the embodiment can be modified and implemented. Differences related to these modifications and applications should be construed as being within the scope of the present disclosure defined by the appended claims.

The invention claimed is:
1. A light-emitting element comprising:
a light-emitting structure including a first semiconductor layer, an active layer, and a second semiconductor layer;
a second conductive layer electrically connected to the second semiconductor layer;
a first conductive layer including a plurality of through electrodes which are disposed in a plurality of via-holes passing through the light-emitting structure and the second conductive layer and are electrically connected to the first semiconductor layer;
an insulating layer configured to electrically insulate the plurality of through electrodes from the active layer, the second semiconductor layer, and the second conductive layer; and
an electrode pad disposed at an outside of the light-emitting structure and connected to the second conductive layer,
wherein the insulating layer includes a plurality of first insulating layers, which are respectively disposed in the plurality of via-holes and insulate the through electrodes from the active layer, the second semiconductor layer, and the second conductive layer,
wherein the first insulating layer includes:
  a plurality of first adjusting portions respectively formed on bottom surfaces of the plurality of via-holes and partially exposing the bottom surfaces of the plurality of via-holes; and
  a plurality of second adjusting portions configured to respectively extend from the plurality of via-holes to the second semiconductor layer, and
wherein widths of the plurality of second adjusting portions decrease going away from the electrode pad so that widths of portions of the second conductive layer disposed between the plurality of through electrodes increase going away from the electrode pad.

2. The light-emitting element of claim 1, wherein the portions of the second conductive layer are disposed between the second adjusting portions.

3. The light-emitting element of claim 2, wherein the insulating layer includes a second insulating layer configured to electrically insulate the plurality of second adjusting portions from the first conductive layer.

4. The light-emitting element of claim 1, wherein distances between the plurality of through electrodes increase going away from the electrode pad.

5. The light-emitting element of claim 1, wherein widths of the plurality of first adjusting portions are the same.

6. The light-emitting element of claim 4, wherein widths of the plurality of first adjusting portions decrease going away from the electrode pad.

7. The light-emitting element of claim 1, further comprising a conductive substrate electrically connected to the first conductive layer.

\* \* \* \* \*